United States Patent
Itoi et al.

(10) Patent No.: US 9,660,202 B2
(45) Date of Patent: May 23, 2017

(54) ORGANIC ELECTROLUMINESCENCE DEVICE

(71) Applicant: SAMSUNG DISPLAY CO., LTD., Yongin, Gyeonggi-Do (KR)

(72) Inventors: Hiroaki Itoi, Yokohama (JP); Ikuo Sasaki, Yokohama (JP); Shuri Sato, Yokohama (JP)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 331 days.

(21) Appl. No.: 14/583,011

(22) Filed: Dec. 24, 2014

(65) Prior Publication Data

US 2015/0188057 A1    Jul. 2, 2015

(30) Foreign Application Priority Data

Dec. 27, 2013  (JP) ................................. 2013-273428
Dec. 27, 2013  (JP) ................................. 2013-273432

(51) Int. Cl.
*H01L 51/50*   (2006.01)
*H01L 51/00*   (2006.01)

(52) U.S. Cl.
CPC ...... *H01L 51/0072* (2013.01); *H01L 51/0054* (2013.01); *H01L 51/5004* (2013.01); *H01L 51/5064* (2013.01); *H01L 51/006* (2013.01); *H01L 51/5012* (2013.01)

(58) Field of Classification Search
None
See application file for complete search history.

(56) References Cited

U.S. PATENT DOCUMENTS

2012/0326137 A1    12/2012  Song et al.

FOREIGN PATENT DOCUMENTS

| EP | 1 645 552 A1 | 4/2006 |
| JP | 2004-529937 A | 9/2004 |
| JP | 2011-109098 A | 6/2011 |
| JP | 2011-187959 A | 9/2011 |
| JP | 2012-092087 A | 5/2012 |

(Continued)

OTHER PUBLICATIONS

Provisional double patenting rejection over claims of the above-identified application; USPTO Office action mailed Oct. 6, 2016, in U.S. Appl. No. 14/332,764.

*Primary Examiner* — Gregory Clark
(74) *Attorney, Agent, or Firm* — Lee & Morse, P.C.

(57) ABSTRACT

An organic electroluminescence (EL) device, including an anode; a cathode; and an emission layer between the anode and the cathode, the emission layer emitting a light via a singlet excited state, a stacking structure of at least three layers having different components being provided between the anode and the emission layer, wherein the stacking structure includes: a first layer including an electron accepting compound having a lowest unoccupied molecular orbital (LUMO) level of about −9.0 eV to about −4.0 eV; a second layer including a compound represented by the following Formula (1), the second layer being closer to the emission layer than the first layer; and a third layer including a compound represented by the following Formula (2), the third layer being closer to the emission layer than the second layer, wherein the emission layer includes a compound represented by the following Formula (3).

5 Claims, 2 Drawing Sheets

(56) References Cited

FOREIGN PATENT DOCUMENTS

| KR | 10-2010-0079458 A | 7/2010 |
| KR | 10-2011-0088898 A | 8/2011 |
| KR | 10-2013-0007159 A | 1/2013 |
| WO | WO 2007/105906 A1 | 9/2007 |
| WO | WO 2010/114021 A1 | 7/2010 |
| WO | WO 2011/090149 A1 | 7/2011 |
| WO | WO 2013/146941 A1 * | 10/2013 ........... C07D 209/86 |

* cited by examiner

ORGANIC ELECTROLUMINESCENCE DEVICE

CROSS-REFERENCE TO RELATED APPLICATIONS

Japanese Patent Application Nos. 2013-273428, filed on Dec. 27, 2013 and 2013-273432, filed on Dec. 27, 2013, in the Japanese Patent Office, and entitled: "Organic Electroluminescence Device," are incorporated by reference herein in their entirety.

BACKGROUND

1. Field

Embodiments relate to an organic electroluminescence device.

2. Description of the Related Art

In recent years, organic electroluminescence (EL) displays, which are one type of image display, have been actively developed. Unlike a liquid crystal display or the like, the organic EL display is a self-luminescent display that recombines holes and electrons injected from an anode and a cathode in an emission layer to thus emit lights from a light-emitting material including an organic compound of the emission layer, thereby performing display.

An example of an organic electroluminescence device (hereinafter referred to as an organic EL device) is an organic EL device that includes an anode, a hole transport layer on the anode, an emission layer on the hole transport layer, an electron transport layer on the emission layer, and a cathode on the electron transport layer. Holes injected from the anode may be injected into the emission layer via the hole transport layer. Electrons may be injected from the cathode, and then injected into the emission layer via the electron transport layer. The holes and the electrons injected into the emission layer may be recombined to generate excitons within the emission layer. The organic EL device may emit light by using lights generated by the radiation and deactivation of the excitons. Also, the organic EL device may be changed in various forms.

SUMMARY

Embodiments are directed to an organic electroluminescence device.

The embodiments may be realized by providing an organic electroluminescence (EL) device, including an anode; a cathode; and an emission layer between the anode and the cathode, the emission layer emitting a light via a singlet excited state, a stacking structure of at least three layers having different components being provided between the anode and the emission layer, wherein the stacking structure includes: a first layer including an electron accepting compound having a lowest unoccupied molecular orbital (LUMO) level of about −9.0 eV to about −4.0 eV; a second layer including a compound represented by the following Formula (1), the second layer being closer to the emission layer than the first layer; and a third layer including a compound represented by the following Formula (2), the third layer being closer to the emission layer than the second layer, wherein the emission layer includes a compound represented by the following Formula (3):

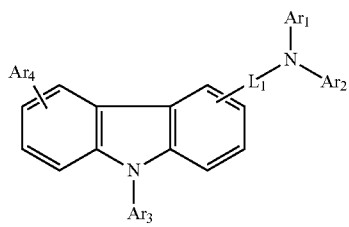

(1)

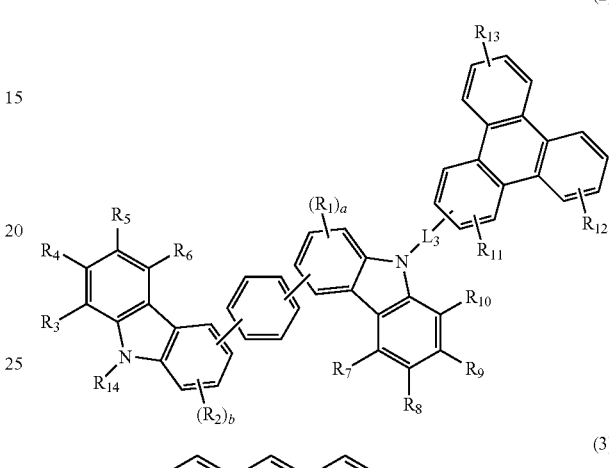

(2)

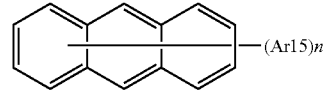

(3)

In Formula (1): $Ar_1$, $Ar_2$, and $Ar_3$ are each independently a substituted or unsubstituted aryl group or a substituted or unsubstituted heteroaryl group, $Ar_4$ is a substituted or unsubstituted aryl group, a substituted or unsubstituted heteroaryl group, a substituted or unsubstituted carbazolyl group, or a substituted or unsubstituted alkyl group, and $L_1$ is a single bond, a substituted or unsubstituted arylene group, or a substituted or unsubstituted heteroarylene group, wherein, in Formula (2): $R_1$ to $R_{13}$ are each independently an aryl group having 6 to 30 ring carbon atoms, a heteroaryl group having 5 to 30 ring carbon atoms, an alkyl group having 1 to 15 carbon atoms, a halogen atom, a hydrogen atom, or a deuterium atom, a and b are each independently an integer of 0 to 3, $R_{14}$ is an aryl group having 6 to 30 ring carbon atoms, a heteroaryl group having 5 to 30 ring carbon atoms, or an alkyl group having 1 to 15 carbon atoms, and $L_3$ is a single bond or a divalent connecting group having at least 4 carbon atoms, and wherein, in Formula (3): each $Ar_{15}$ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a heterocyclic group having 5 to 50 ring atoms, a substituted or unsubstituted silyl group, a carboxylic group, a halogen atom, a cyano group, a nitro group or a hydroxyl group, and n is an integer from 1 to 10.

The first layer may be disposed near the anode.

The third layer may be disposed near the emission layer.

A compound having a carbazolyl group may be included in the first layer, the second layer, and the third layer of the stacking structure.

The compound represented by the above Formula (1) or Formula (2) may be included in the first layer, the second layer, and the third layer of the stacking structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
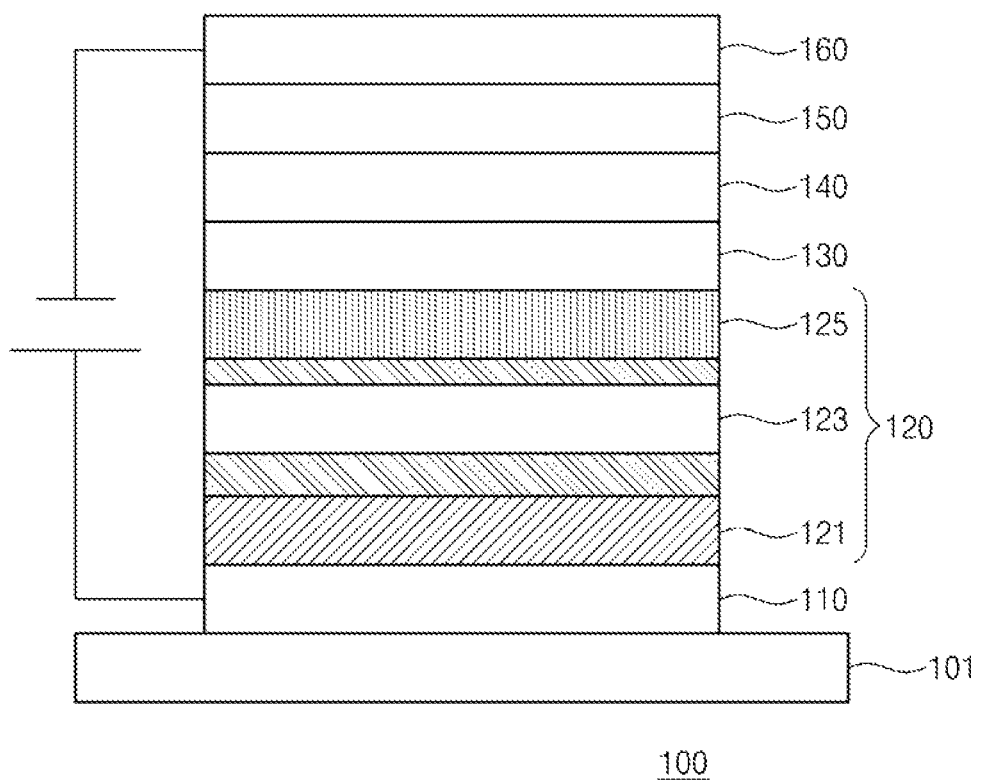
FIG. 1 illustrates a diagram of an organic EL device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

According to an embodiment, hole injection properties at an anode may be improved by disposing a layer formed by using an electron accepting material at the anode side. In an implementation, a stacking layer of multiple layers having hole transporting properties may be included as one structure between an emission layer and an anode. For example, an electron accepting material layer may be stacked at the anode side of the stacking structure, a compound including a carbazolyl group may be stacked on the stacking structure having the hole transporting properties, and/or an intermediate layer including an amine derivative having a carbazolyl group may be stacked on the emission layer side.

FIG. 1 illustrates a schematic diagram of an organic EL device 100 according to an embodiment. According to an embodiment, an organic EL device 100 may include an anode 110 on a substrate 101, an emission layer 130 (realizing light emission via mainly a singlet excited state), an electron transport layer 140, an electron injection layer 150, and a cathode 160. Between the anode 110 and the emission layer 130, a hole transport zone 120 may be disposed. The hole transport zone 120 may be a zone for disposing, e.g., a hole transport layer, a hole injection layer, etc.

According to an embodiment, a stacking structure of at least three layers having different layer components may be included in the hole transport zone 120 between the anode 110 and the emission layer 130 to help drive the organic EL device 100 at a low voltage, to help improve emission efficiency, and to help realize long life. The stacking structure may include a first layer 121, a second layer 123, and a third layer 125. At least one layer at the side of the anode 110 in the stacking structure (e.g., the first layer 121) may be formed by using or may include an electron accepting compound having a LUMO (lowest unoccupied molecular orbital) level of about −9.0 eV to about −4.0 eV. At least one layer at a side or position of the stacking structure closer to the emission layer 130 than the first layer 121 (e.g., the second layer 123) may include a compound represented by the following Formula (1). In an implementation, at least one layer at a side or position of the stacking structure closer to the emission layer 130 than the second layer 123 (e.g., the third layer 125) may include a compound represented by the following Formula (2). In an implementation, the emission layer 130 may include a compound represented by the following Formula (3).

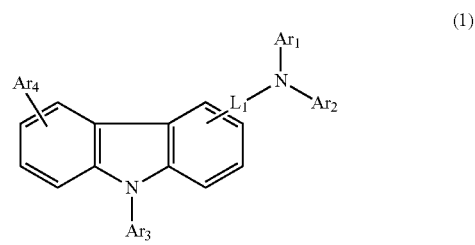

(1)

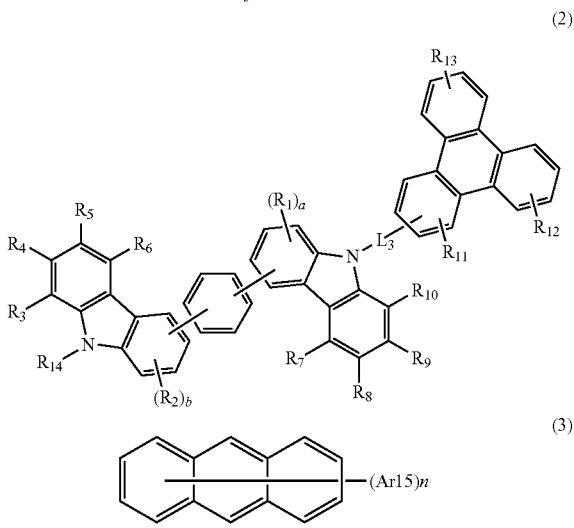

(2)

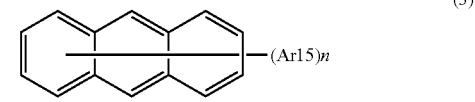

(3)

In Formula (1), $Ar_1$, $Ar_2$, and $Ar_3$ may each independently be a substituted or unsubstituted aryl group or a substituted or unsubstituted heteroaryl group, $Ar_4$ may be a substituted or unsubstituted aryl group, a substituted or unsubstituted heteroaryl group, a substituted or unsubstituted carbazolyl group, or a substituted or unsubstituted alkyl group having 1 to 15 carbon atoms, $L_1$ may be a single bond, a substituted or unsubstituted arylene group, or a substituted or unsubstituted heteroarylene group. In an implementation, Ar1 and Ar2 may be fused or connected to form a ring.

In Formula (2), $R_1$ to $R_{13}$ may each independently be an aryl group having 6 to 30 ring carbon atoms, a heteroaryl group having 5 to 30 ring atoms, e.g., ring carbon atoms, an alkyl group having 1 to 15 carbon atoms, a halogen atom, a hydrogen atom, or a deuterium atom, and a and b may each independently be an integer of 0 to 3, $R_{14}$ may be an aryl group having 6 to 30 ring carbon atoms, a heteroaryl group having 5 to 30 ring atoms, e.g., ring carbon atoms, or an alkyl group having 1 to 15 carbon atoms, and $L_3$ may be a single bond or a divalent connecting group having at least 4 carbon atoms.

In Formula (3), each $Ar_{15}$ may independently be a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a heterocyclic group having 5 to 50 ring atoms, e.g., ring carbon atoms, a substituted or unsubstituted silyl group, a carboxylic group, a halogen atom, a cyano group, a nitro group or a hydroxyl group, and n may be an integer of 1 to 10, e.g., of 1 or 2.

The electron accepting compound according to an embodiment may be one of the following Compounds 1 to 14.

1

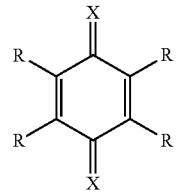

2

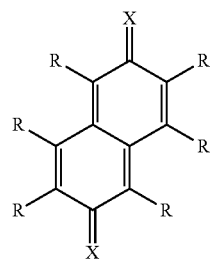

3

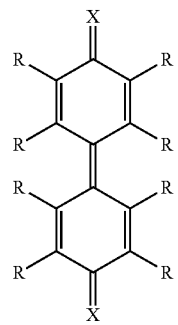

4

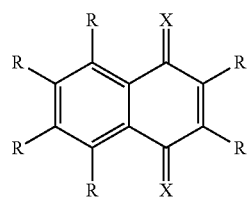

-continued

5

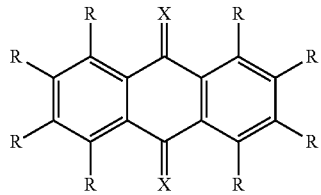

6

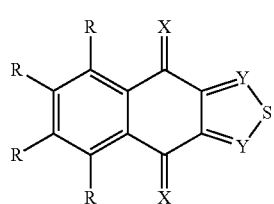

7

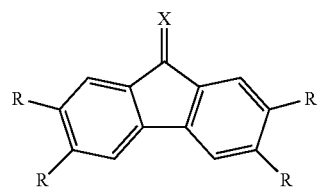

8

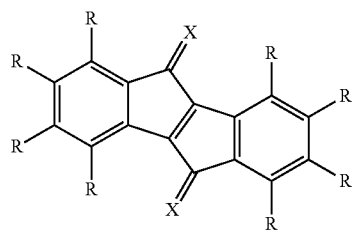

9

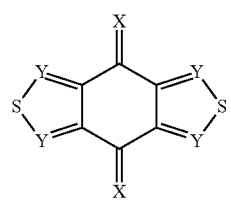

10

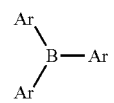

11

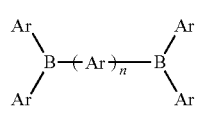

12

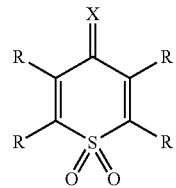

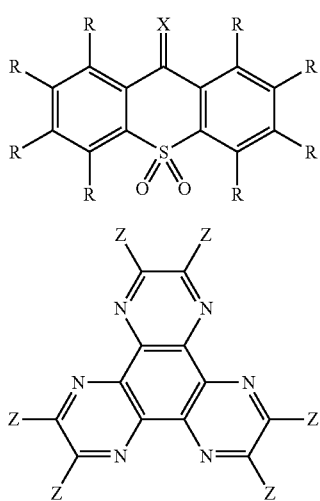

In the above Compounds 1 to 14, R may be a hydrogen atom, a deuterium atom, a halogen atom, a fluorinated alkyl group having 1 to 50 carbon atoms, a cyano group, an alkoxy group having 1 to 50 carbon atoms, an alkyl group having 1 to 50 carbon atoms, or an aryl group or a heteroaryl group having 5 to 50 carbon atoms. In an implementation, the compound may not have the same substituents, e.g., all the same substituents, of the hydrogen atom, the deuterium atom, or the fluorine atom in one molecule. Ar may be an aryl group having 5 to 50 carbon atoms or a heteroaryl group having 5 to 50 carbon atoms, and may have electron withdrawing properties. Each Ar may be the same substituent or different substituent. Y may be a methine group (—CH═) or a nitrogen atom (—N═). Z may be a pseudohalogen group or sulfur (S). X may be one of the following substituents X1 to X7.

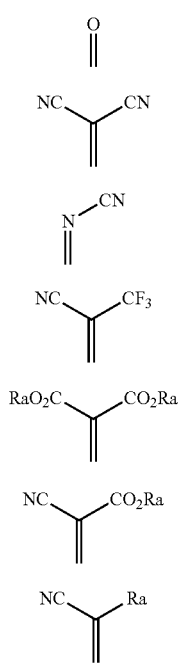

In X1 to X7, Ra may be a hydrogen atom, a deuterium atom, a halogen atom, a fluorinated alkyl group having 1 to 50 carbon atoms, a cyano group, an alkoxy group having 1 to 50 carbon atoms, an alkyl group having 1 to 50 carbon atoms, an aryl group having 5 to 50 carbon atoms, or a heteroaryl group having 5 to 50 carbon atoms.

The substituted or unsubstituted aryl group or heteroaryl group having 5 to 20 ring atoms may include, e.g., a phenyl group, a 1-naphtyl group, a 2-naphtyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, a m-tolyl group, a p-tolyl group, a p-t-butylphenyl group, a p-(2-phenylpropyl)phenyl group, a 3-methyl-2-naphtyl group, a 4-methyl-1-naphtyl group, a 4-methyl-1-anthryl group, a 4'-methylbiphenylyl group, a 4''-t-butyl-p-terphenyl-4-yl group, a fluoranthenyl group, a fluorenyl group, a 1-pyrrolyl group, a 2-pyrrolyl group, a 3-pyrrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-fenoxadinyl group, a 2-fenoxadinyl group, a 3-fenoxadinyl group, a 4-fenoxadinyl group, a 10-fenoxadinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, etc.

The substituted or unsubstituted fluorinated alkyl group having 1 to 50 carbon atoms may include, e.g., a perfluoro alkyl group such as a trifluoromethyl group, a pentafluoroethyl group, a heptafluoropropyl group, a heptadecafluorooctane group, etc., a monofluoromethyl group, a difluoromethyl group, a trifluoroethyl group, a tetrafluoropropyl group, an octafluoropentyl group, etc.

The substituted or unsubstituted alkyl group having 1 to 50 carbon atoms may include, e.g., a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc. without limitation.

The substituted or unsubstituted alkoxy group having 1 to 50 carbon atoms is a group represented by —OY, and Y may include, e.g., a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

The halogen atom may include, e.g., fluorine, chlorine, bromine, or iodine.

In Formula (1), $Ar_1$, $Ar_2$, $Ar_3$, and $Ar_4$ may each independently include, e.g., a phenyl group, a biphenyl group, a terphenyl group, a naphtyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxazolyl group, a benzoimidazolyl group, a pyrazolyl group, a dibenzofuranyl group, and a dibenzothienyl group, etc. In an implementation, $Ar_1$, $Ar_2$, $Ar_3$, and $Ar_4$ may each independently include, e.g., the phenyl group, the biphenyl group, the terphenyl group, the fluorenyl group, the carbazolyl group, the dibenzofuranyl group, etc.

In Formula (1), $L_1$ may include, e.g., a phenylene group, a biphenylene group, a terphenylene group, a naphthalene group, an anthrylene group, a phenanthrylene group, a fluorenylene group, an indenylene group, a pyrenylene group, an acetonaphthenylene group, a fluroranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, and a dibenzothienylene group, etc. In an implementation, $L_1$ may include, e.g., the phenylene group, the biphenylene group, the terphenylene group, the fluorenylene group, the carbazolylene group, the dibenzofuranylene group, etc.

In an implementation, the compound represented by the above Formula (1) may be represented by one of the following Formulae 15 to 20.

15

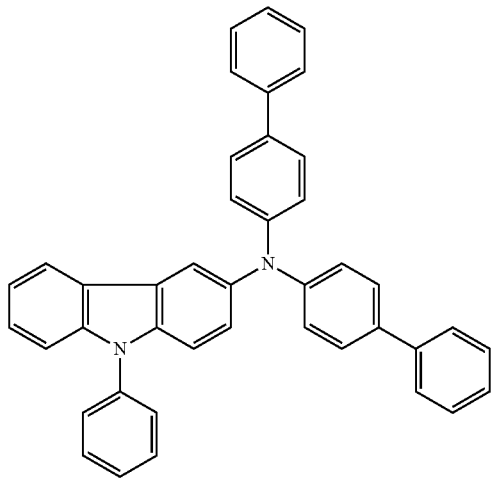

16

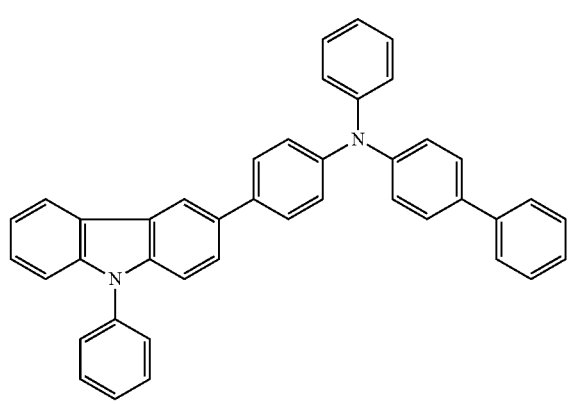

17

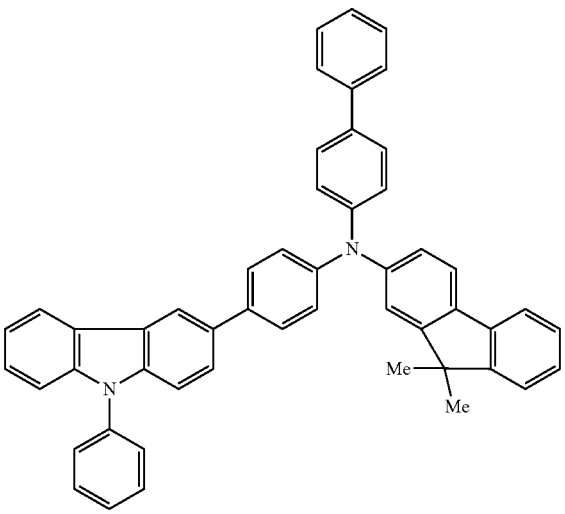

18

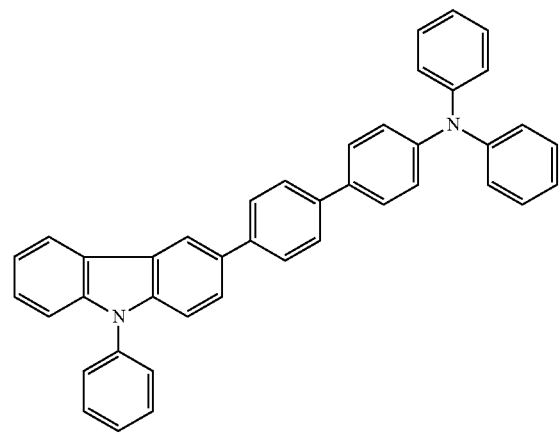

19

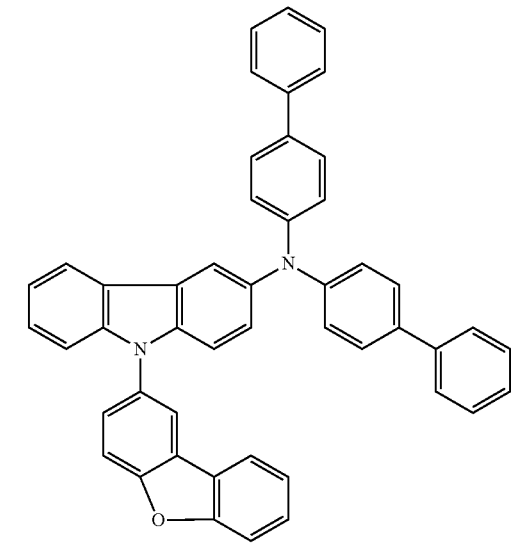

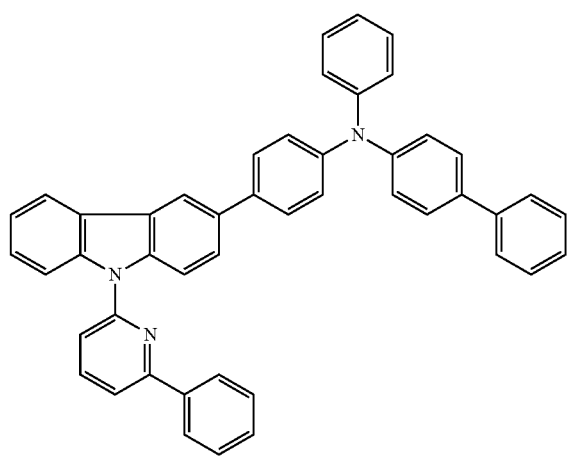
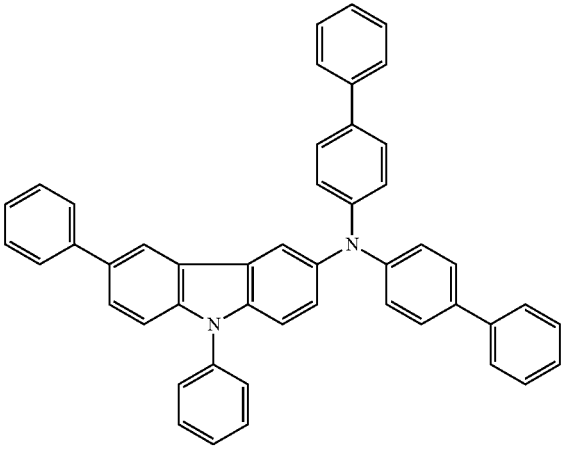
In an implementation, the compound represented by the above Formula (1) may be represented by one of the following Formulae 21 to 26.
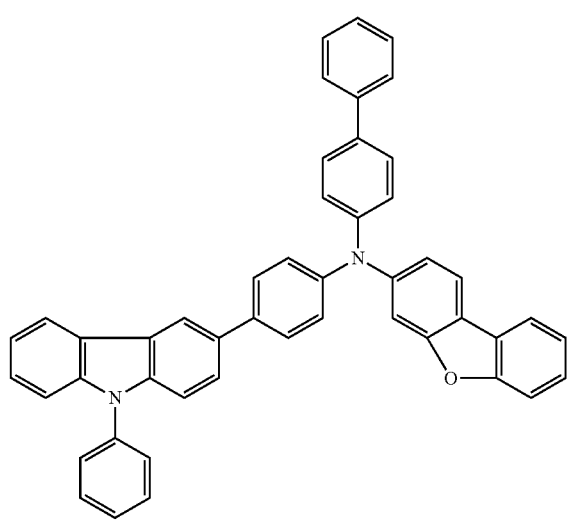
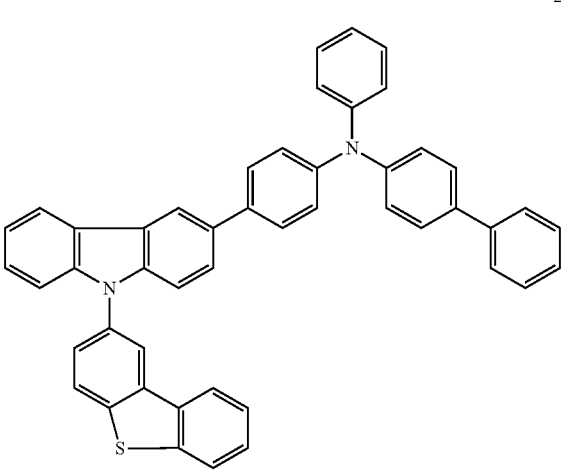
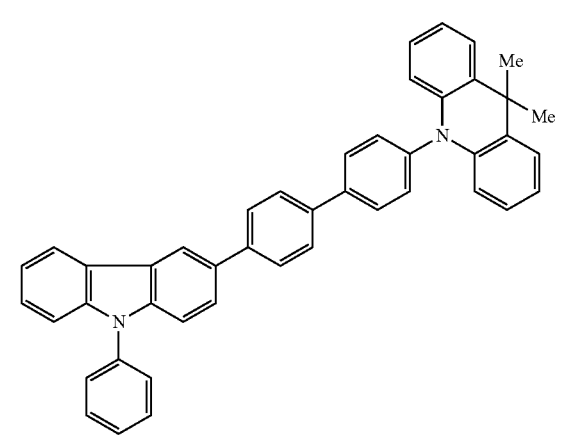
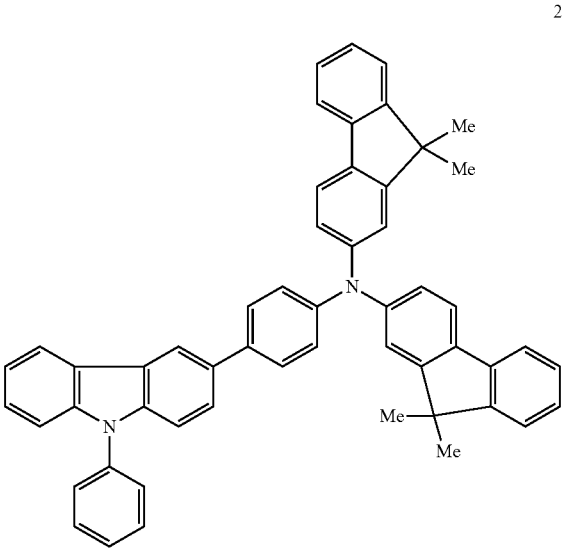

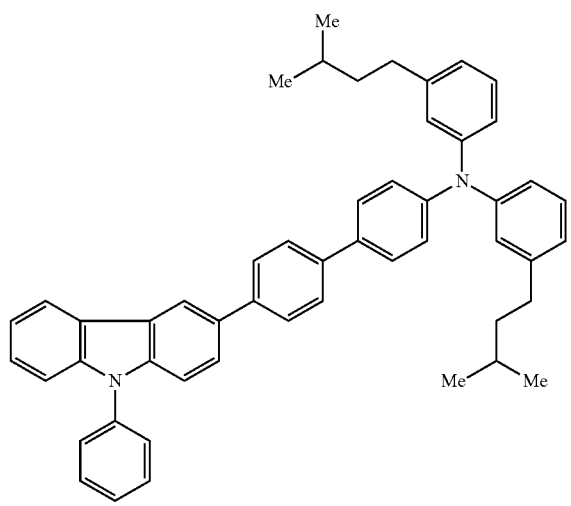

26

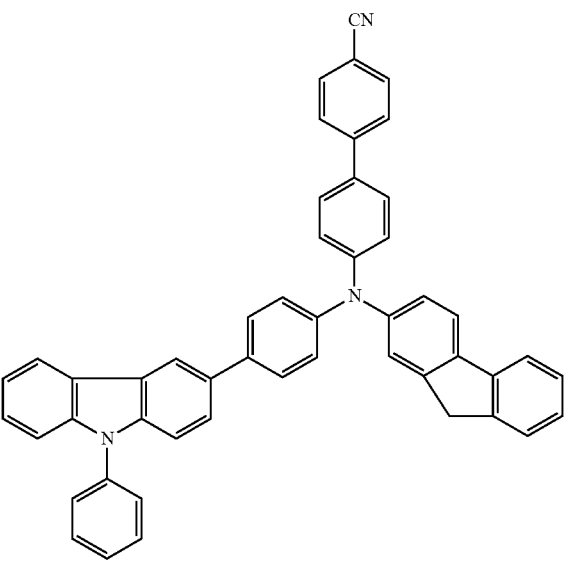

29

In an implementation, the compound represented by the above Formula (1) may be represented by one of the following Formulae 27 to 30.

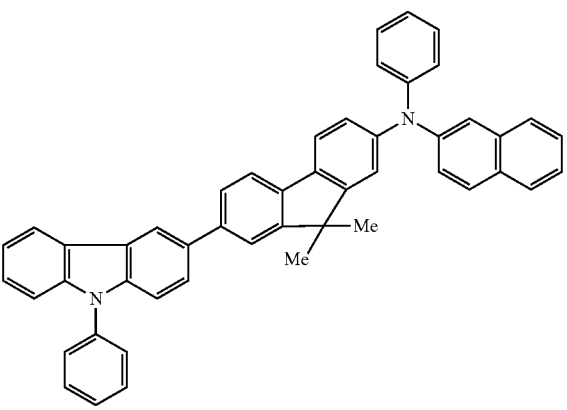

30

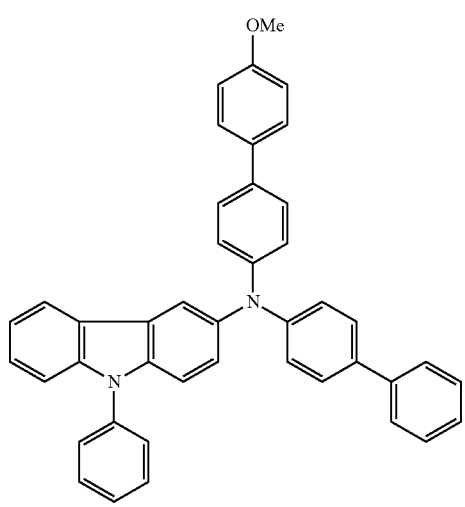

27

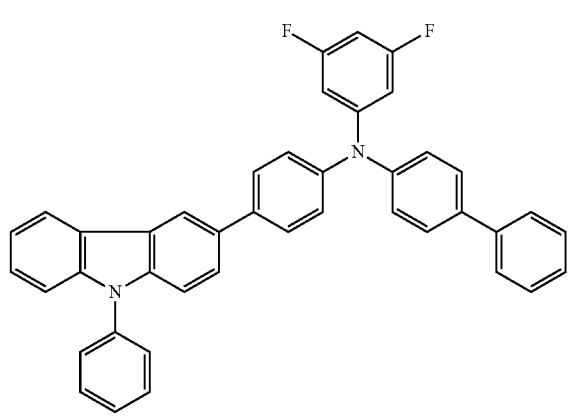

28

In Formula (2), $R_1$ to $R_{14}$ may each independently include, e.g., a phenyl group, a biphenyl group, a terphenyl group, a naphtyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxazolyl group, a benzoimidazolyl group, a pyrazolyl group, a dibenzofuranyl group, and a dibenzothienyl group, etc. In an implementation, $R_1$ to $R_{14}$ may each independently include, e.g., the phenyl group, the biphenyl group, the terphenyl group, the fluorenyl group, the carbazolyl group, the dibenzofuranyl group, etc.

In Formula (2), $L_3$ may include, e.g., a phenylene group, a biphenylene group, a terphenylene group, a naphthalene group, an anthrylene group, a phenanthrylene group, a fluorenyl group, an indenylene group, a pyrenylene group, an acetonaphthenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, and a dibenzothienalylene group, etc. In an implementation, $L_3$ may include, e.g., the phenylene group, the biphenylene group, the terphenylene group, the fluorenylene group, the carbazolylene group, the dibenzofuranylene group, etc.

In an implementation, the compound represented by the above Formula (2) may be represented by one of the following Formulae 31 to 36.

31

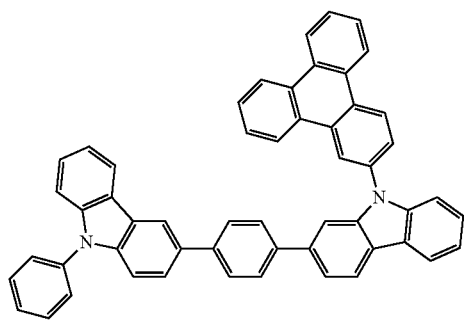

32

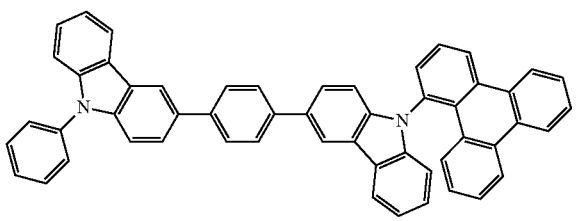

33

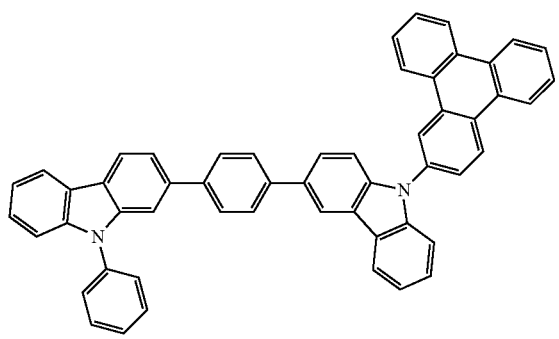

34

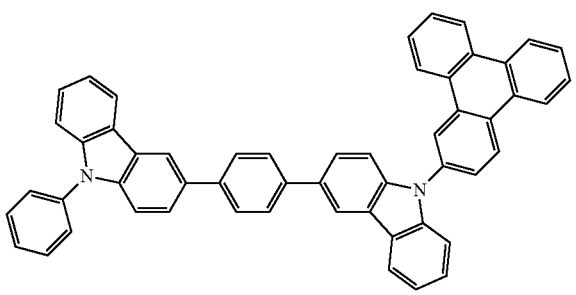

35

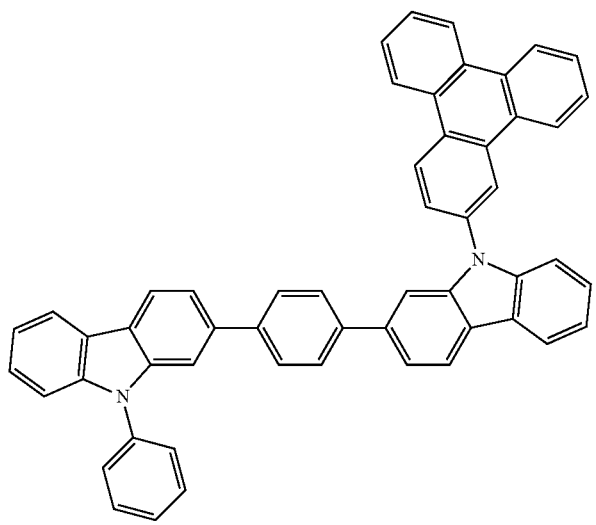

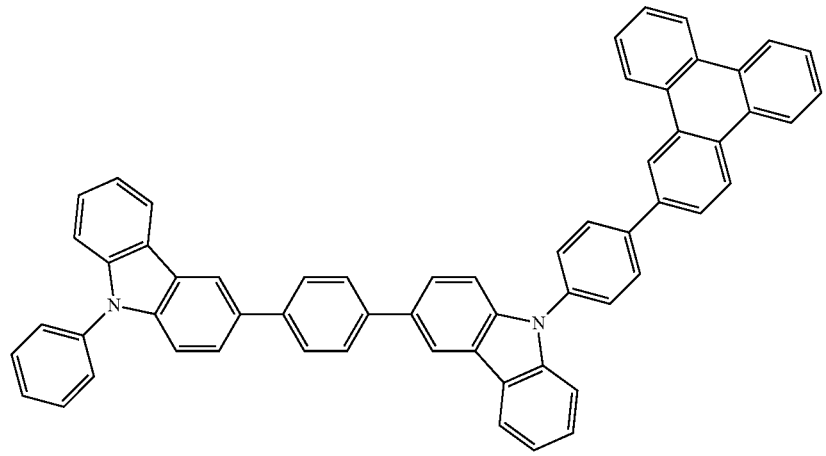
36
In an implementation, the compound represented by the above Formula (2) may be represented by one of the following Formulae 37 to 42.
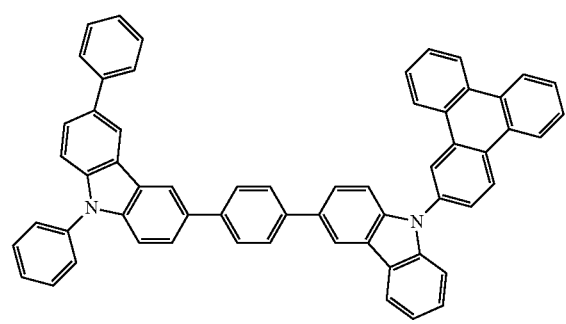
37
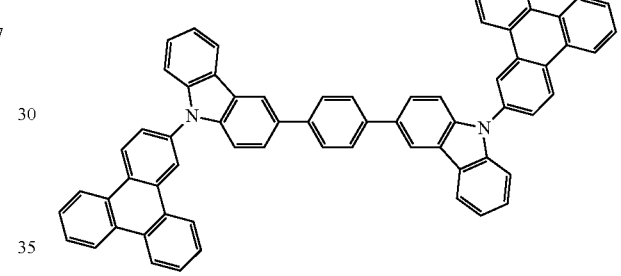
40
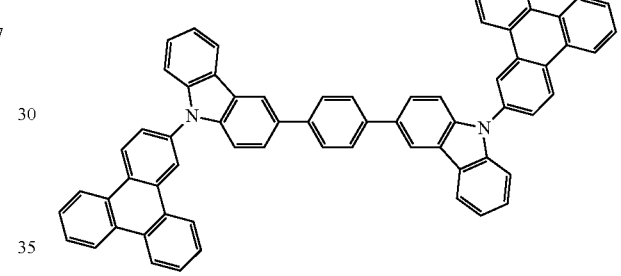
41
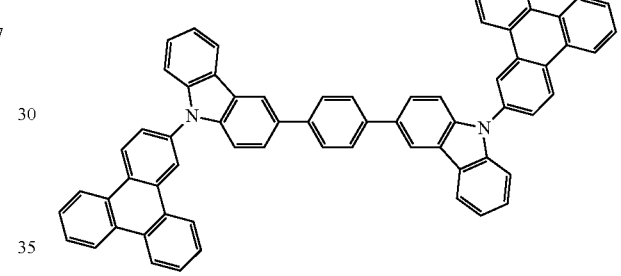
38
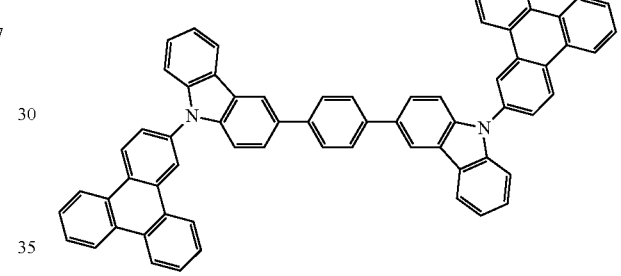
39
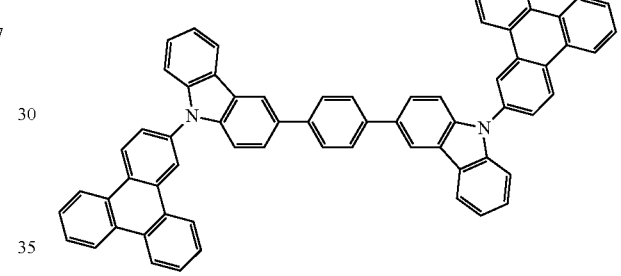
42

In an implementation, the compound represented by the above Formula (2) may be represented by one of the following Formulae 43 to 48.
43
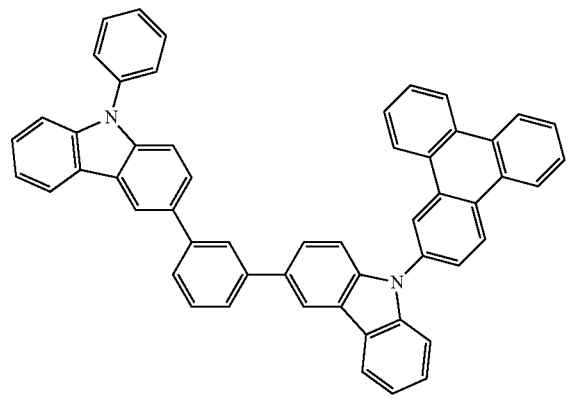
47
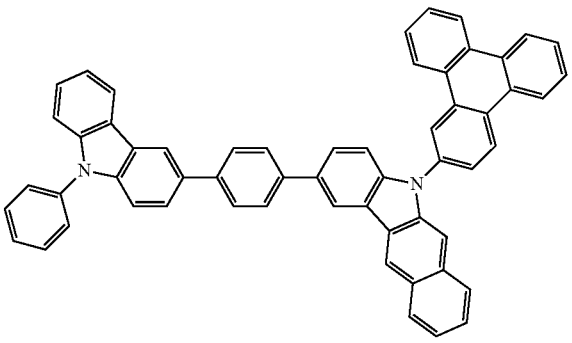
44
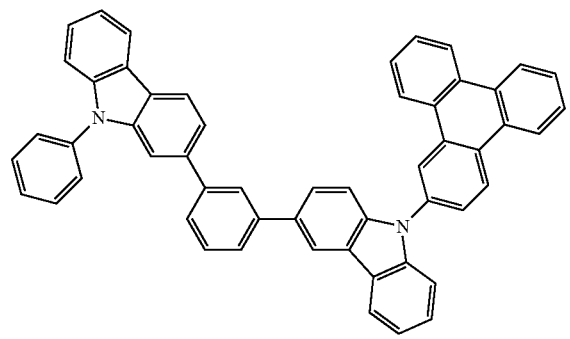
48
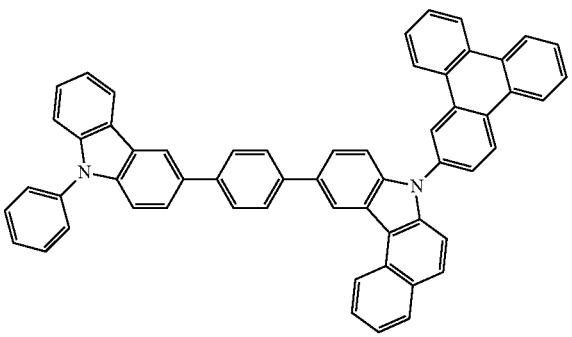
In an implementation, the compound represented by the above Formula (2) may be represented by one of the following Formulae 49 to 52.
45
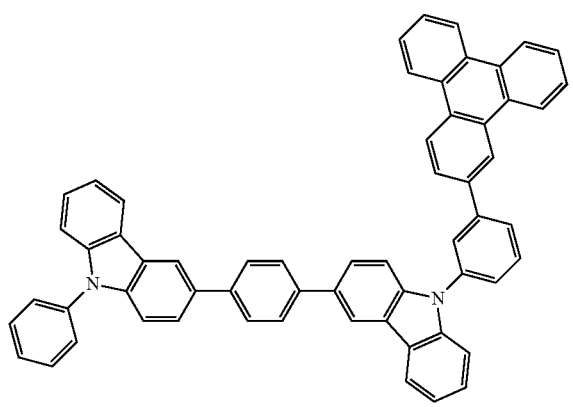
49
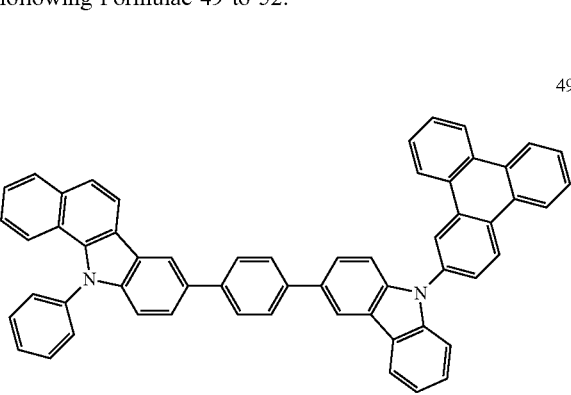
46
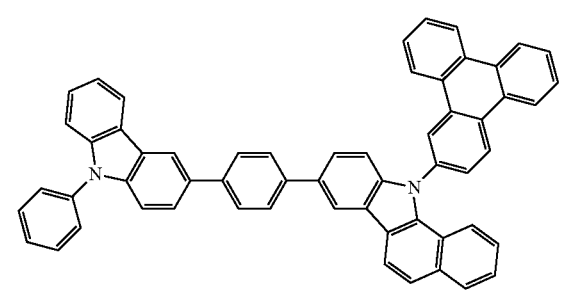
50
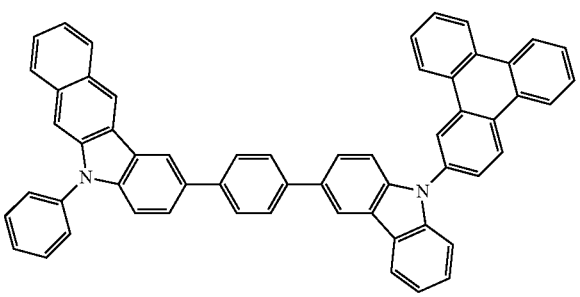

-continued

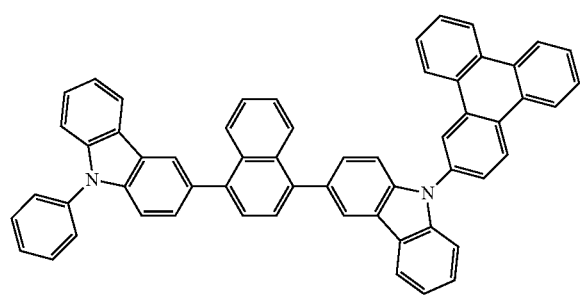
51

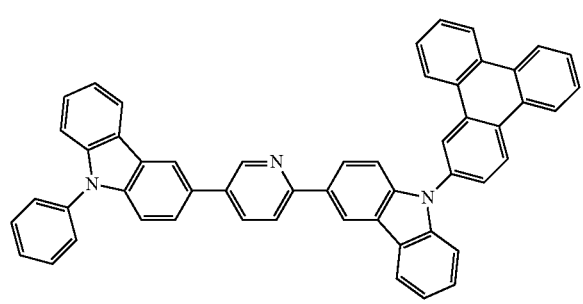
52

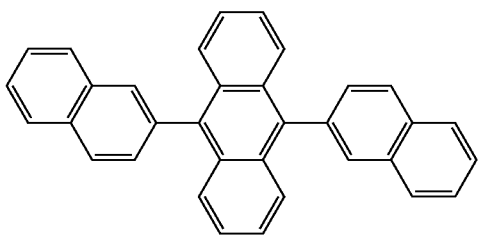
54

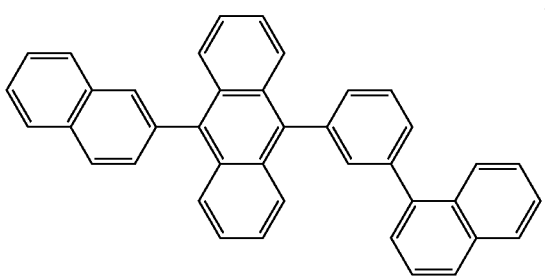
55

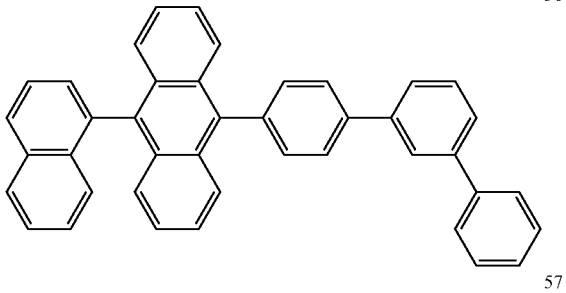
56

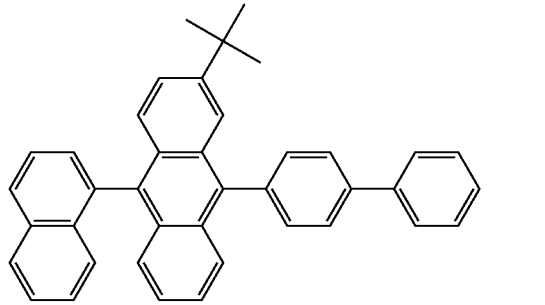
57

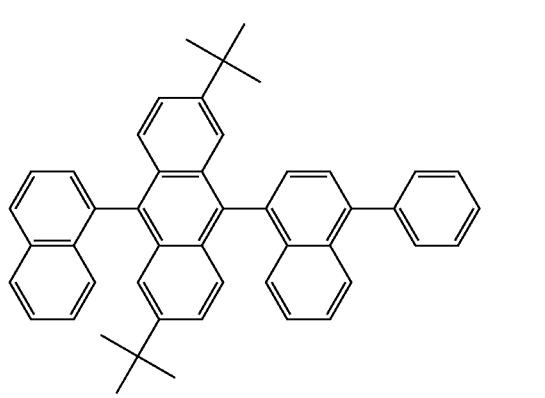
58

In Formula (3), Arts may be, e.g., one of the following substituents. In an implementation, in the case that at least two of $Ar_{15}$ are present, two or more of Arts may be the same or different substituents. In an implementation, $Ar_{15}$ may include, e.g., a phenyl group, a biphenyl group, a terphenyl group, a naphtyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxazolyl group, a benzoimidazolyl group, a pyrazolyl group, a dibenzofuranyl group, and a dibenzothienyl group, etc. In implementation, $Ar_{15}$ may include, e.g., the phenyl group, the biphenyl group, the terphenyl group, the fluorenyl group, the carbazolyl group, the dibenzofuranyl group, etc.

In an implementation, the emission layer 130 may include a compound represented by one of the following Formulae 53 to 58.

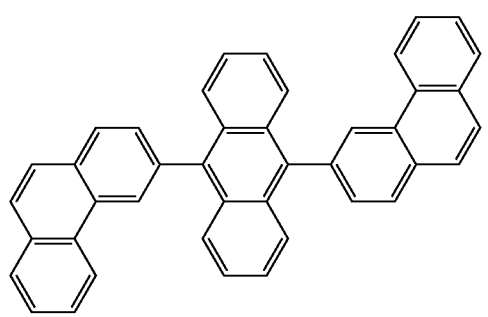
53

The organic EL device 100 may include the stacking structure of at least three layers having different layer forming components in the hole transport zone 120. The stacking structure may include the electron accepting material or compound having a LUMO level about −9.0 eV to about −4.0 eV and may help improve the hole transporting properties from the anode 110. In an implementation, a layer including the electron accepting compound may be disposed near, adjacent to, and/or contacting the anode 110 (e.g., the first layer 121), and the hole injection properties from the anode 110 of the organic EL device 100 may be markedly improved. This effect may be markedly improved in combination with the emission layer 130 including the compound represented by the above Formula (3). Thus, driving of the organic EL device 100 at a low voltage may be realized.

The organic EL device 100 according to an embodiment may include the hole transporting second layer 123 or third layer 125 including a compound having a carbazolyl group. The hole transporting stacking structure may be passivated from the electrons not consumed in the emission layer 130. In addition, the diffusion of energy of an excited state generated in the emission layer 130 to the hole transporting stacking structure may be prevented, and the total charge balance of the organic EL device 100 may be controlled.

As described above, the first layer 121 including the electron accepting compound may be disposed near, may be adjacent to, and/or may contact the anode 110 (e.g., as the hole injection layer). For example, in the organic EL device 100 according to an embodiment, the second layer 123 including the compound represented by the above Formula (1) and the third layer 125 including the compound represented by the above Formula (2) may be closer to the emission layer 130, when compared to the first layer 121 that includes the electron accepting compound. According to an embodiment, charge transporting properties and durability on current flowing may be improved by including the compound containing the carbazolyl group in the hole transporting stacking structure (e.g., in the second layer 123 and/or the third layer 125).

In addition, in the organic EL device 100, the third layer 125 (including the compound represented by Formula (2)) may be disposed closer to the emission layer 130, when compared to the second layer 123 (including the compound represented by Formula (1)). Disposing the third layer 125 (including the compound represented by Formula (2)) closer to the emission layer 130 may help ensure that the hole transporting stacking structure (e.g., the first layer 121 and the second layer 123) is passivated from the electrons not consumed in the emission layer 130, and the diffusion of the energy of an excited state generated in the emission layer 130 into the first layer 121 and the second layer 123 may be prevented. In an implementation, the third layer 125 (including, e.g., the compound represented by Formula (2) and/or (3)) may be disposed near, e.g., adjacent to or in contact with, the emission layer 130.

In an implementation, the emission layer 130 may include a compound represented by one of the following Formulae 59 to 64.

59

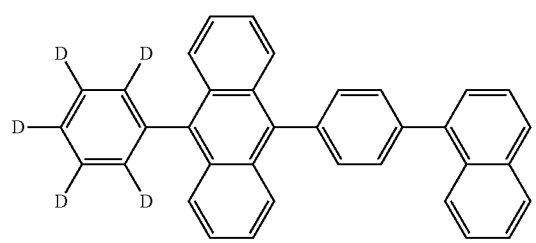

60

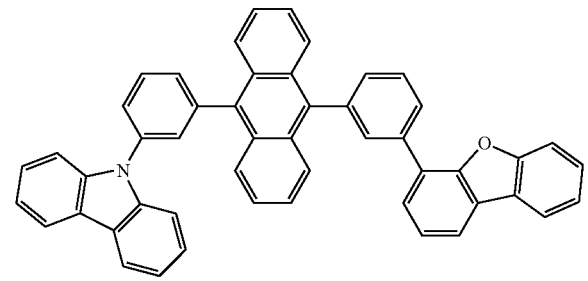

61

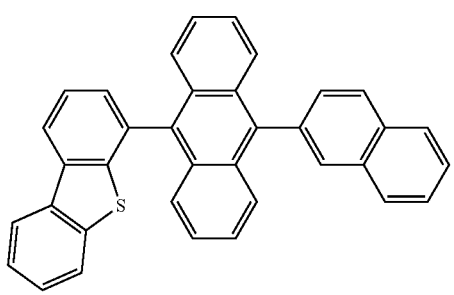

62

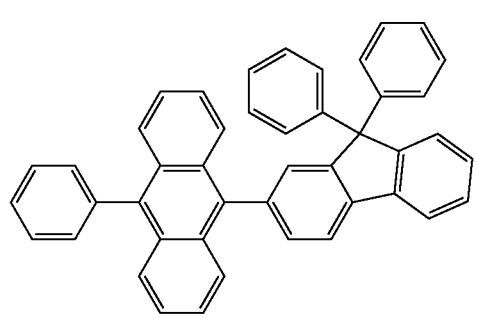

63

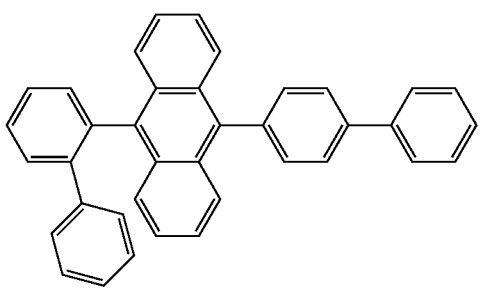

64

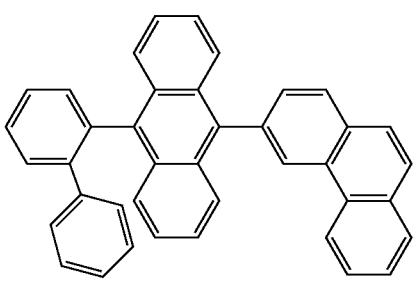

In an implementation, in the organic EL device 100, all layers (e.g., except for the first layer 121) in the stacking structure may include a compound having a carbazolyl group. Including the compound having the carbazolyl group in the hole transporting stacking structure may help improve the charge transporting properties and the durability on current flowing. In an implementation, in the organic EL device 100, all layers (e.g., except for the first layer 121) in the stacking structure may include a compound represented by Formula (1) and/or (2). Thus, the hole transporting stacking structure may be passivated from the electrons not consumed in the emission layer 130, and the diffusion of the energy of an excited state generated at the emission layer 130 into the hole transporting stacking structure may be prevented.

Hereinafter, the organic EL device according to an embodiment will be described in detail. In the organic EL device 100 according to an embodiment, a substrate 101 may be, e.g., a transparent glass substrate, a semiconductor substrate formed by using silicon, etc., or a flexible substrate of a resin. An anode 110 may be disposed on the substrate 101 and may be formed by using or may include, e.g., indium tin oxide (ITO) or indium zinc oxide (IZO).

As described above, a hole transporting zone 120 may be disposed between the anode 110 and the emission layer 130. For example, a hole injection layer (e.g., first layer 121) may be formed on the anode 110 and may include the electron accepting compound.

On the hole injection layer, a hole transport layer (e.g., second layer 123) may be formed using a material including a hole transport material represented by the above Formula (1). In an implementation, the hole transport layer may be obtained by stacking a plurality of layers as the second layer 123. In an implementation, the electron accepting material may be included in the hole transport layer (e.g., the second layer 123) at the hole injection layer (e.g., first layer 121) side thereof.

On the hole transport layer, an interlayer (e.g., third layer 125) may be formed using a material including a hole transport material represented by the above Formula (2). The interlayer may be disposed near or adjacent to the emission layer 130. Thus, the hole transporting stacking structure may be passivated from the electron not consumed in the emission layer 130, and the diffusion of the energy of an excited state generated at the emission layer 130 into the hole transporting stacking structure may be prevented, and a total charge balance of the organic EL device 100 may be maintained. The interlayer may be near or adjacent to the emission layer 130, and the diffusion of the electron accepting compound into the emission layer 130 may be restrained, and the emission efficiency and life of the organic EL device may be improved.

On the interlayer, the emission layer 130 may be formed using a material including a compound represented by the above Formula (3). In an implementation, the emission layer 130 may include suitable p-type impurities, e.g., tetra-t-butylperylene (TBP).

On the emission layer 130, an electron transport layer 140 may be formed using, e.g., a material including tris(8-hydroxyquinolinato)aluminum (Alq3). On the electron transport layer 140, an electron injection layer 150 may be formed using, e.g., a material including lithium fluoride, lithium-8-quinolinato, etc. In addition, on the electron injection layer 150, a cathode 160 may be formed using, e.g., a metal such as Al, Ag, Ca, etc., or a transparent material such as ITO, IZO, etc.

The thin layers may be formed by selecting an appropriate layer forming method such as vacuum deposition, sputtering, various coatings, etc. according to the material used.

In the organic EL device according to an embodiment, the material for the organic EL device may be applied in an active matrix organic EL display device using a thin film transistor (TFT).

In the organic EL device 100 according to an embodiment, the hole transport stacking structure may be passivated from the electrons not consumed in the emission layer 130, and the diffusion of the energy of an excited state generated at the emission layer 130 into the hole transport stacking structure may be prevented by matching the above-described layer structure and the materials. Thus, total charge balance of the organic EL, device 100 may be maintained. In addition, by disposing the interlayer (e.g., third layer 125) near the emission layer 130, the diffusion of the electron accepting compound (e.g., from the first layer 121 and/or second layer 123) into the emission layer 130 may be restrained, and the emission efficiency and the life of the organic EL device may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

Preparation

Figure 2:
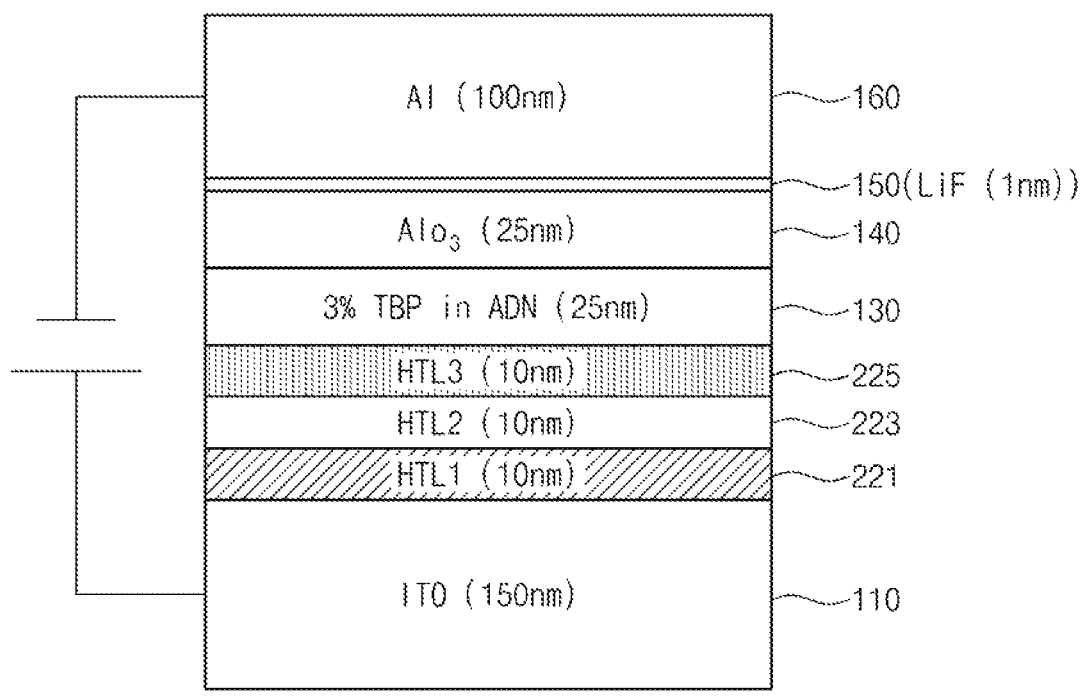
FIG. 2 illustrates a diagram of an organic EL device according to an embodiment.

An organic EL device according to Example 1 was manufactured by using the above-described materials. FIG. 2 illustrates a diagram of an organic EL device 200 according to an embodiment. In Example 1, an anode 110 was formed using ITO with a thickness of about 150 nm. A hole injection layer 221 (HTL1) was formed using Compound 59, below, with a thickness of about 10 nm. Compound 17, below, was used to form a hole transport layer 223 (HTL2) with a thickness of about 10 nm. In addition, Compound 34, below, was used to form an intermediate layer 225 (HTL3) with a thickness of about 10 nm.

17

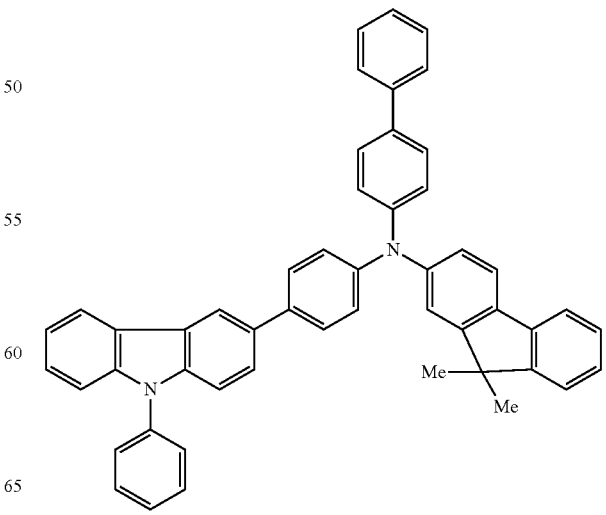

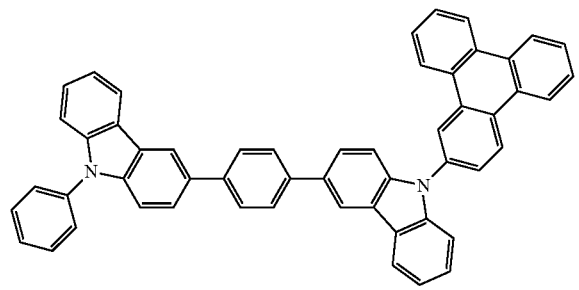

34

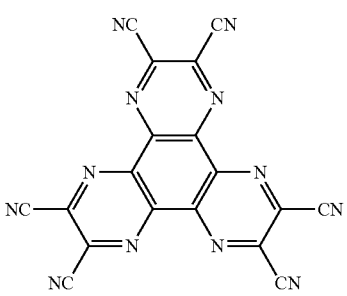

(LUMO Value: -4.40 eV)

Then, an emission layer 130 was formed by doping 3% tetra-t-butylperylene (TBP) into a host material including 9,10-di(2-naphthyl)anthracene (ADN) (as the compound represented by the above Formula (3)) with a thickness of about 25 nm. An electron transport layer 140 was formed using Alq3 with a thickness of about 25 nm, an electron injection layer 150 was formed using LiF with a thickness of about 1 nm, and a cathode 116 was formed using Al with a thickness of about 100 nm.

As Comparative Examples, organic EL devices were manufactured variously using the following Compounds 60 to 62 in HTL1 to HTL3, in addition or as an alternative to the above-described materials and/or layers, as shown in Table 1, below.

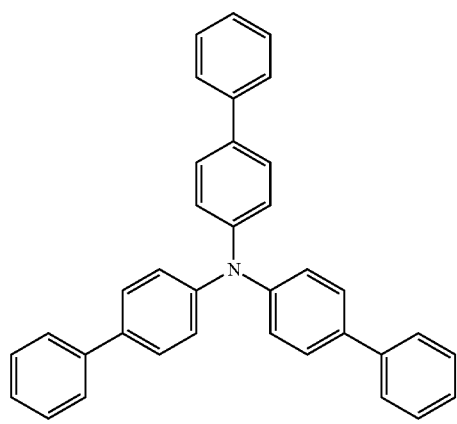

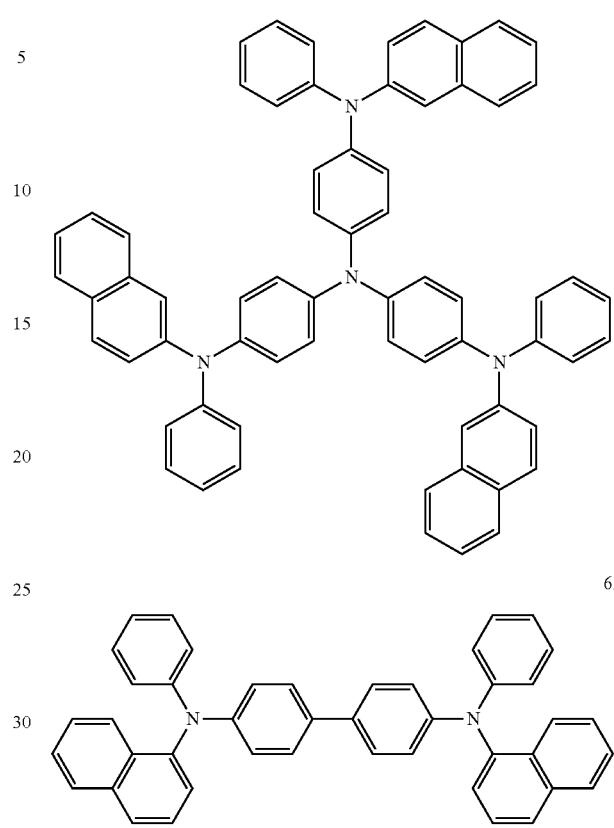

With respect to the organic EL devices thus manufactured, the compounds used in HTL1 to HTL3 are summarized in the following Table 1.

TABLE 1

|  | HTL1 | HTL2 | HTL3 |
|---|---|---|---|
| Example 1 | Compound 59 | Compound 17 | Compound 34 |
| Comparative Example 1 | Compound 59 | Compound 34 | Compound 17 |
| Comparative Example 2 | Compound 34 | Compound 59 | Compound 34 |
| Comparative Example 3 | Compound 59 | Compound 17 | Compound 17 |
| Comparative Example 4 | Compound 59 | Compound 17 | Compound 60 |
| Comparative Example 5 | Compound 61 | Compound 17 | Compound 60 |
| Comparative Example 6 | Compound 61 | Compound 62 | Compound 34 |
| Comparative Example 7 | Compound 61 | Compound 62 | Compound 60 |

With respect to the organic EL devices according to Example 1 and Comparative Examples 1 to 7, voltage, emission efficiency, and half-life were evaluated. Here, current density was 10 mA/cm$^2$. The evaluation results are illustrated in the following Table 2.

TABLE 2

|  | Voltage (V) | Emission efficiency (cd/A) | Half-life (hr) |
|---|---|---|---|
| Example 1 | 6.5 | 7.7 | 3,500 |
| Comparative Example 1 | 6.8 | 6.5 | 3,100 |
| Comparative Example 2 | 6.9 | 6.7 | 3,200 |
| Comparative Example 3 | 6.6 | 6.5 | 2,900 |
| Comparative Example 4 | 7.5 | 6.5 | 1,800 |
| Comparative Example 5 | 7.5 | 4.9 | 1,500 |
| Comparative Example 6 | 7.5 | 4.9 | 1,700 |
| Comparative Example 7 | 8.1 | 4.3 | 700 |

As may be seen in Table 2, the emission efficiency was improved in Example 1, when compared to Comparative Example 1 (in which the compounds in HTL2 and HTL3 were exchanged) and Comparative Example 2 (in which HTL1 and HTL3 included Compound 34). In addition, the emission efficiency was substantially improved in Example 1 when compared to Comparative Example 3 (in which the same Compound 17 was used in HTL2 and HTL3). When compared to Comparative Example 4 (in which non-carbazole-based hole transport, Compound 60, was used in HTL3), the emission efficiency of Example 1 was even more improved.

When compared to Comparative Examples 5, 6 and 7 (in which a starburst type hole injection material, i.e., an electron accepting compound, was used in a layer adjacent to an anode), the emission efficiency was improved in Example 1. In addition, the lowering of the driving voltage of the organic EL device 200 was observed. From the lowering of the voltage and the improvement of the emission efficiency, the importance or effect of (1) the presence of the electron accepting compound in one of the layers of HTL1 to HTL3, and/or (2) the presence of the carbazole-based hole transport compound layer near the emission layer 130 may be observed. In addition, when examining Comparative Example 7 (in which each layer between the anode 110 and the emission layer 130 (except for the electron accepting compound layer) was composed of a non-carbazole-containing compound), the life of the organic EL device 200 was largely decreased when compared to Comparative Examples 5 and 6 (in which carbazole-containing Compound 17 or Compound 34 was present in HTL2 layer or HTL3 layer). When considering the life difference in Comparative Example 3 and Comparative Example 4, the concentration of a carbazole derivative in a layer stacked between the anode 110 and the emission layer 130 may have an effect in confirming the life of the device.

Examples 2 and 3

Preparation

Organic EL devices according to Examples 2 and 3 were manufactured by using the above-described materials as shown in FIG. 2. An anode 110 was formed using ITO with a thickness of about 150 nm. Compound 17 was used as the compound represented by the above Formula (1) to form a layer having a thickness of about 10 nm. A hole injection layer 221 as HTL1 was formed by doping Compound 59 as the compound represented by the above Compound 30. A hole transport layer 223 (HTL2) was formed using Compound 17 with a thickness of about 10 nm. In addition, Compound 34 (Example 2) or Compound 36 (Example 3) were used as the compound represented by the above Formula (2) in HTL3, which was formed as an intermediate layer 225 with a thickness of about 10 nm.

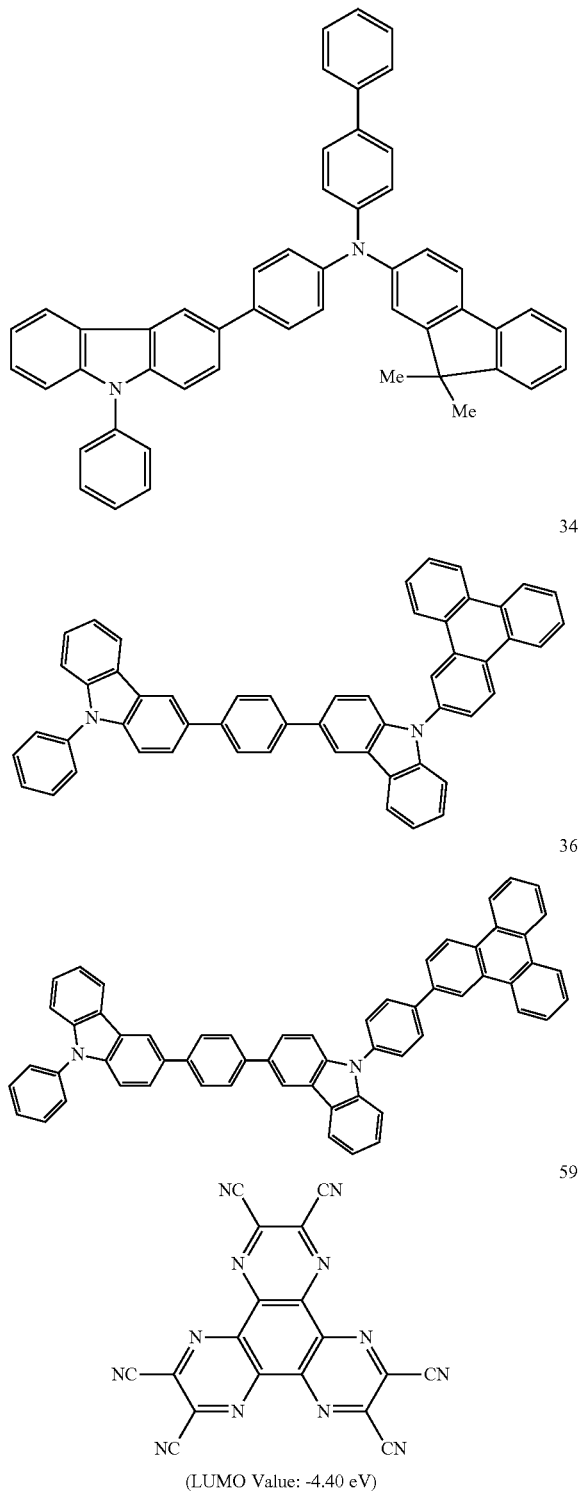

Then, an emission layer 130 was formed by doping 3% TBP in a host material including ADN (as the compound represented by the above Formula (3)) with a thickness of about 25 nm. An electron transport layer 140 was formed using Alq3 with a thickness of about 25 nm, an electron injection layer 150 was formed using LiF with a thickness of about 1 nm, and a cathode 116 was formed using Al with a thickness of about 100 nm.

As Comparative Examples, organic EL devices were manufactured using the following Compounds 60 to 62, in addition to or as replacements for the above-described compounds in HTL1 to HTL3, as may be seen in Table 3, below.

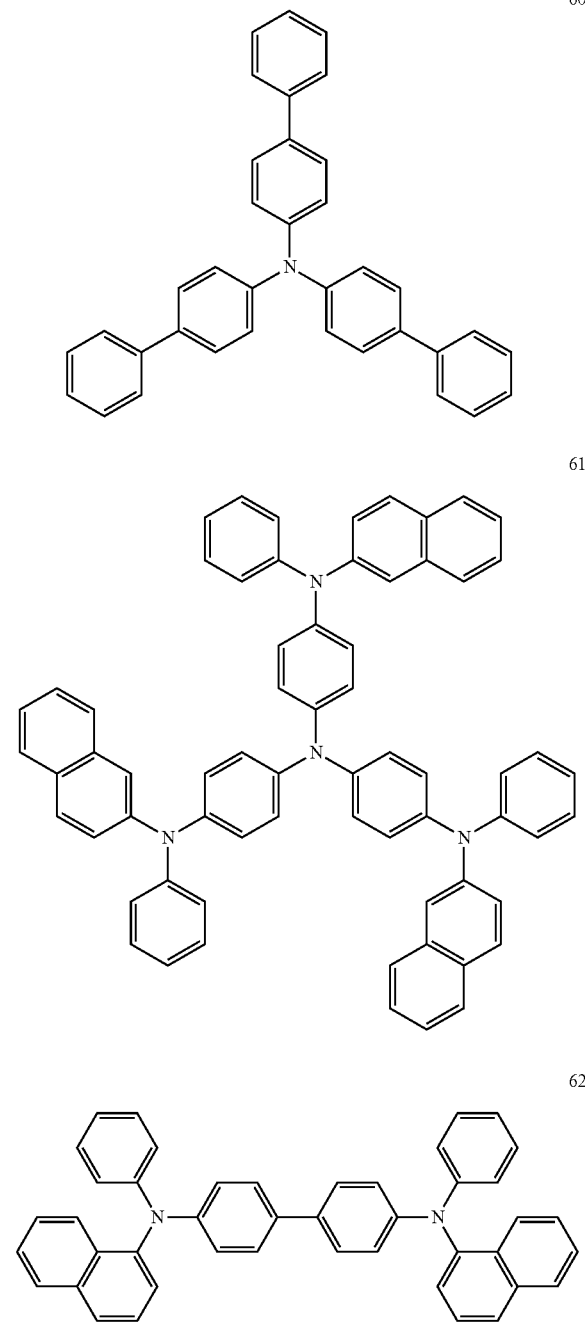 [SMILES: c1ccc(-c2ccc(N(c3ccc(-c4ccccc4)cc3)c3ccc(-c4ccccc4)cc3)cc2)cc1 ; c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1 ; c1ccc(N(c2ccc(-c3ccc(N(c4ccccc4)c4cccc5ccccc45)cc3)cc2)c2cccc3ccccc23)cc1]

With respect to the organic EL devices thus manufactured, the compounds used for HTL1 to HTL3 are summarized in the following Table 3.

TABLE 3

| | HTL1 | HTL2 | HTL3 |
|---|---|---|---|
| Example 2 | Compounds 17 + 59 | Compound 17 | Compound 34 |
| Example 3 | Compounds 17 + 59 | Compound 17 | Compound 36 |
| Comparative Example 8 | Compounds 61 + 59 | Compound 17 | Compound 34 |
| Comparative Example 9 | Compounds 17 + 59 | Compound 34 | Compound 17 |
| Comparative Example 10 | Compound 34 | Compounds 17 + 59 | Compound 34 |
| Comparative Example 11 | Compounds 17 + 59 | Compound 17 | Compound 17 |
| Comparative Example 12 | Compounds 17 + 59 | Compound 17 | Compound 60 |
| Comparative Example 13 | Compound 61 | Compound 17 | Compound 60 |
| Comparative Example 14 | Compound 61 | Compound 62 | Compound 34 |
| Comparative Example 15 | Compound 61 | Compound 62 | Compound 60 |
| Comparative Example 16 | Compound 17 | Compound 17 | Compound 34 |

With respect to the organic EL devices according to Examples 2 and 3 and Comparative Examples 8 to 16, voltage, emission efficiency, and half-life were evaluated. Here, current density was 10 mA/cm$^2$. The evaluation results are illustrated in the following Table 4.

TABLE 4

| | Voltage (V) | Emission efficiency (cd/A) | Half-life (h) |
|---|---|---|---|
| Example 2 | 6.3 | 7.7 | 3,700 |
| Example 3 | 6.4 | 7.5 | 3,500 |
| Comparative Example 8 | 6.9 | 7.5 | 2,800 |
| Comparative Example 9 | 6.7 | 6.6 | 3,200 |
| Comparative Example 10 | 6.8 | 6.8 | 3,100 |
| Comparative Example 11 | 6.5 | 6.6 | 3,000 |
| Comparative Example 12 | 7.5 | 5.5 | 2,300 |
| Comparative Example 13 | 7.5 | 4.9 | 1,500 |
| Comparative Example 14 | 7.5 | 4.9 | 1,700 |
| Comparative Example 15 | 8.1 | 4.3 | 700 |
| Comparative Example 16 | 8.0 | 4.5 | 1,000 |

As may be seen in Table 4, the driving voltage was lowered and the life was increased in Examples 2 and 3, when compared to Comparative Example 16, in which Compound 59 was not doped in HTL1. In addition, when comparing Example 2 to Comparative Example 8, in which the electron accepting compound was doped with a non-carbazole-based hole transport material, Compound 34, the driving voltage was lowered, and the life of the device was increased at the same time in Example 2. The emission efficiency of Examples 2 and 3 was increased, when compared to Comparative Example 9 (in which the hole transport compound layer of HTL2 and HTL3 were exchanged), and Comparative Example 10 (in which the electron accepting compound layer was inserted in HTL1 and HTL3 using the same Compound 34). In addition, when compared to Comparative Example 11 (in which the same Compound 17 was used in HTL2 and HTL3), the emission efficiency was improved in Examples 2 and 3. The emission efficiency was also improved relative to Comparative Example 12, in which the non-carbazole-based hole transport Compound 60 was used in HTL3.

When compared to Comparative Examples 12, 13, and 14, in which a starburst type hole injection material, i.e., an electron accepting compound, was used in an adjacent layer to an anode, the emission efficiency was improved in Examples 2 and 3. In addition, the lowering of the driving voltage of the organic EL device was observed. From the lowering of the voltage and the improvement of the emission efficiency, the importance or effect of (1) the presence of the electron accepting compound in one of the layers of HTL1 to HTL3, or (2) the presence of the carbazole-based hole transport compound layer adjacent to the emission layer 110 may be observed. In addition, when comparing Comparative Example 15 (in which each layer between the anode and the emission layer was composed of the non-carbazole compound), the life of the organic EL device was largely decreased, when compared to Comparative Examples 13 and 14 (in which carbazole Compound 17 or Compound 34 was included in HTL2 or HTL3). When considering the life difference in Comparative Example 11 and Comparative Example 12, the concentration of a carbazole derivative in a layer stacked between the anode 110 and the emission layer 130 may be very important to confirm the life of the device.

By way of summation and review, an organic EL device in a display apparatus may exhibit a low driving voltage, high efficiency, and long life of the organic EL device. For example, in a blue emitting region and a green emitting region, the emission efficiency and the life of the organic EL device may be insufficient. To realize driving at a low voltage with high efficiency of the organic EL device, the normalization and the stabilization of the zones of an anode and an emission layer, and an emission layer may be important. Thus, a layer composed of a material having electron accepting properties (e.g., an acceptor layer) may be formed to assist the hole transportation. In the device having the above structure, electron acceptors may be diffused in the emission layer during flowing current, thereby decreasing life.

A hole transport material used in a hole transport layer may include various compounds, e.g., an anthracene derivative or an aromatic amine-based compound. A decrease in the driving voltage and realizing high efficiency of an organic EL device may be desirable.

The configuration of materials of layers may realize an organic EL device driven at a lower voltage and having high power efficiency and long life.

The embodiments may provide an organic EL device realizing low voltage driving, high power efficiency and long life.

In the organic EL device according to an embodiment, the hole transporting stacking structure may be passivated from electrons not consumed in the emission layer, and the diffusion of energy at an excited state generated at the emission layer into the hole transporting stacking structure may be prevented.

The charge transporting properties and the durability on current flowing of the organic EL device according to an embodiment may be improved by including the compound having the carbazolyl group in the hole transporting stacking structure.

In the organic EL device according to an embodiment, the hole transporting stacking structure may be passivated from electrons not consumed in the emission layer, and the diffusion of energy at an excited state generated at the emission layer into the hole transporting stacking structure may be prevented. In addition, the charge transporting properties and the durability on current flowing may be improved by including the compound having the carbazolyl group in the hole transporting stacking structure.

According to an embodiment, an organic EL device capable of driving at a low voltage and having high efficiency and long life may be provided.

The embodiments may provide an organic electroluminescence device driven at a low voltage and having high efficiency and long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence (EL) device, comprising:
    an anode;
    a cathode; and
    an emission layer between the anode and the cathode, the emission layer emitting a light via a singlet excited state,
    a stacking structure of at least three layers having different components being provided between the anode and the emission layer,
    wherein the stacking structure includes:
        a first layer including an electron accepting compound having a lowest unoccupied molecular orbital (LUMO) level of about −9.0 eV to about −4.0 eV;
        a second layer including a compound represented by the following Formula (1), the second layer being closer to the emission layer than the first layer; and
        a third layer including a compound represented by the following Formula (2), the third layer being closer to the emission layer than the second layer,
    wherein the emission layer includes a compound represented by the following Formula (3):

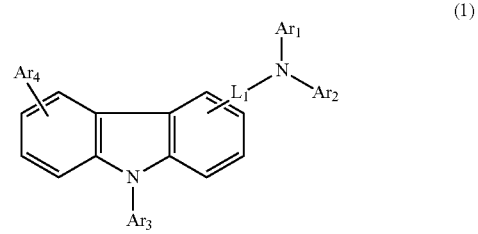

-continued

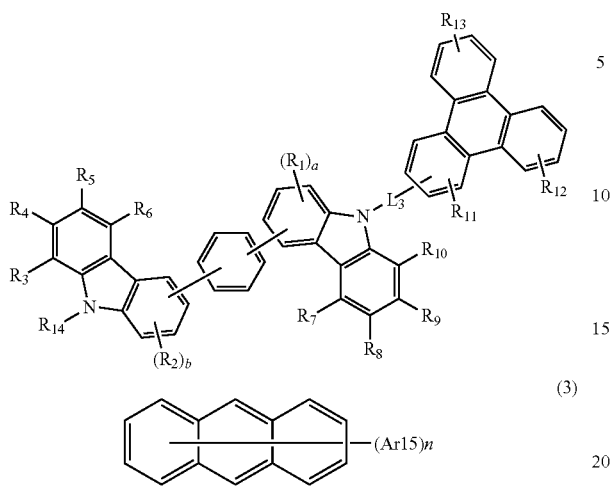

wherein, in Formula (1):
Ar₁, Ar₂, and Ar₃ are each independently a substituted or unsubstituted aryl group or a substituted or unsubstituted heteroaryl group,
Ar₄ is a substituted or unsubstituted aryl group, a substituted or unsubstituted heteroaryl group, a substituted or unsubstituted carbazolyl group, or a substituted or unsubstituted alkyl group, and
L₁ is a single bond, a substituted or unsubstituted arylene group, or a substituted or unsubstituted heteroarylene group,
wherein, in Formula (2):
R₁ to R₁₃ are each independently an aryl group having 6 to 30 ring carbon atoms, a heteroaryl group having 5 to 30 ring carbon atoms, an alkyl group having 1 to 15 carbon atoms, a halogen atom, a hydrogen atom, or a deuterium atom,
a and b are each independently an integer of 0 to 3,
R₁₄ is an aryl group having 6 to 30 ring carbon atoms, a heteroaryl group having 5 to 30 ring carbon atoms, or an alkyl group having 1 to 15 carbon atoms, and
L₃ is a single bond or a divalent connecting group having at least 4 carbon atoms, and
wherein, in Formula (3):
each Ar₁₅ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted alkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a heterocyclic group having 5 to 50 ring atoms, a substituted or unsubstituted silyl group, a carboxylic group, a halogen atom, a cyano group, a nitro group or a hydroxyl group, and
n is an integer from 1 to 10.

2. The organic EL device as claimed in claim 1, wherein the first layer is disposed near the anode.

3. The organic EL device as claimed in claim 2, wherein the third layer is disposed near the emission layer.

4. The organic EL device as claimed in claim 1, wherein a compound having a carbazolyl group is included in the first layer, the second layer, and the third layer of the stacking structure.

5. The organic EL device as claimed in claim 4, wherein the compound represented by the above Formula (1) or Formula (2) is included in the first layer, the second layer, and the third layer of the stacking structure.

* * * * *

UNITED STATES PATENT AND TRADEMARK OFFICE
CERTIFICATE OF CORRECTION

| | |
|---|---|
| PATENT NO. | : 9,660,202 B2 |
| APPLICATION NO. | : 14/583011 |
| DATED | : May 23, 2017 |
| INVENTOR(S) | : Hiroaki Itoi et al. |

Page 1 of 1

It is certified that error appears in the above-identified patent and that said Letters Patent is hereby corrected as shown below:

On the Title Page

Page 2, Item (56) titled References Cited, under Foreign Patent Documents:
"WO 2013/146941 A1"
Should read:
-- WO 2013/146942 A1 12/2015 --

Signed and Sealed this
Second Day of July, 2019

Andrei Iancu
*Director of the United States Patent and Trademark Office*